(12) United States Patent
Sugiura et al.

(10) Patent No.: US 6,527,027 B2
(45) Date of Patent: Mar. 4, 2003

(54) SINGLE-POINT BONDING APPARATUS

(75) Inventors: Kazuo Sugiura, Akishima (JP); Koichi Takahashi, Tachikawa (JP); Shigeru Shiozawa, Higashiyamato (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 7 days.

(21) Appl. No.: 09/915,617

(22) Filed: Jul. 26, 2001

(65) Prior Publication Data

US 2002/0011313 A1 Jan. 31, 2002

(30) Foreign Application Priority Data

Jul. 27, 2000 (JP) .......................... 2000-227170

(51) Int. Cl.⁷ ................................ B23K 3/00
(52) U.S. Cl. .................. 156/389; 156/281; 156/499; 156/580.1; 228/4.5
(58) Field of Search ..................... 156/73.1, 281, 156/285, 499, 536, 580.1, 580.2, 389; 228/110.1, 1.1, 4.5, 178, 180.5

(56) References Cited

U.S. PATENT DOCUMENTS

| | | | | |
|---|---|---|---|---|
| 5,221,037 A | * | 6/1993 | Terakado et al. | 228/102 |
| 5,259,548 A | * | 11/1993 | Yamazaki et al. | 228/180.5 |
| 5,316,201 A | * | 5/1994 | Sugiura | 228/4.5 |
| 5,524,811 A | * | 6/1996 | Terakado et al. | 228/110.1 |
| 6,129,255 A | * | 10/2000 | Terakado et al. | 228/4.5 |
| 6,161,747 A | * | 12/2000 | Ushiki et al. | 228/4.5 |

FOREIGN PATENT DOCUMENTS

| | | |
|---|---|---|
| JP | H2-248055 | 10/1990 |
| JP | H2-299247 | 12/1990 |
| JP | H4-24933 | 1/1992 |
| JP | H7-321143 | 12/1995 |
| JP | H8-153748 | 6/1996 |

* cited by examiner

Primary Examiner—James Sells
(74) Attorney, Agent, or Firm—Koda & Androlia

(57) ABSTRACT

In a single-point bonding apparatus that connects the end portions of leads or the cut end portions of leads to pads respectively by pressing such end portions of leads or cut end portions of leads with a tool, a cleaning stage that is used to clean the tool is additionally provided, and a cleaning chip is disposed on the surface of the cleaning stage.

2 Claims, 3 Drawing Sheets

SINGLE-POINT BONDING APPARATUS

BACKGROUND OF THE INVENTION

1. Field of the Invention

The present invention relates to a single-point bonding apparatus and more particularly to a single-point bonding apparatus that is equipped with a tool cleaning means.

2. Prior Art

Single-point bonding apparatuses are described in, for instance, Japanese Patent Application Laid-Open (Kokai) Nos. H4-24933, H8-153748 and H2-299247.

In these single-point bonding methods, the end portions of leads or the cut end portions of leads are connected respectively to pads by pressing the end portions or cut end portions of leads by means of a tool or a bonding tool. For this reason, the tip end of the tool is finely worked to a size of 125 µm square or less.

A conventional single-point bonding method will be described with reference to FIGS. 3.

When a tool 14 is lowered in step (a) from a point above a lead 51 disposed on a tape 50 and the tool 14 contacts the end portion 51a of the lead 51, the tool 14 is in step (b) subsequently lowered more gradually than in step (a) while pressing the tip end of the lead 51 downward. Then, bonding is performed by application of pressure in step (c). In FIG. 3, the reference numeral 53 is a circuit board, 54 is a chip, and 55 is a pad.

Examples of conventional bonding apparatuses equipped with a tool cleaning means are described in, for instance, Japanese Patent Application Laid-Open (Kokai) Nos. H2-248055 and H7-321143. However, these apparatuses are wire bonding apparatuses being different from single-point bonding apparatuses.

The apparatus described in Japanese Patent Application Laid-Open (Kokai) No. H2-248055 uses a rotating polishing tape or grindstone as a cleaning means.

The apparatus described in Japanese Patent Application Laid-Open (Kokai) No. H2-248055 uses a rotating polishing tape or grindstone as a cleaning means. Accordingly, when the tool is to be cleaned, cleaning is accomplished by pressing the tip end of the tool against the polishing tape or grindstone.

The apparatus described in Japanese Patent Application Laid-Open (Kokai) No. H17-321143 is equipped with a cleaning liquid tank and an air nozzle installed on a cleaning stage as a cleaning means. When the tool is to be cleaned, the tip end portion of the tool is immersed in the cleaning liquid inside the cleaning liquid tank, an ultrasonic vibration is applied to the tool, and the tip end portion of the tool is then wiped clean by means of air that is blown out of the air nozzle while the tool is moving to the bonding stage.

In the above two prior arts, the tool that is cleaned is the tool of a wire bonding apparatus.

In Japanese Patent Application Laid-Open (Kokai) No. H2-248055, when the polishing tape or grindstone is pressed against the tool, the tip end of the tool may be damaged, or the useful life of the tool may be shortened. In particular, the tip end of the tool of a single-point bonding apparatus (which is the object of the invention of the present application) is finely worked to a size of 125 µm square or smaller as described above. Accordingly, if the tool is pressed against a polishing tape or grindstone, or if the tool is immersed in a cleaning liquid and an ultrasonic vibration is applied to the tool, the tip end of the tool will break off so that the tool cannot be reused.

On the other hand, a method in which the tool is immersed in a cleaning liquid and an ultrasonic vibration is applied to the tool as in Japanese Patent Application Laid-Open (Kokai) No. H7-321143 is effective in cases where there is foreign matter adhering lightly to the tool. However, if such foreign matter adheres strongly to the tool, complete removal of the foreign matter is difficult. Furthermore, the use of a cleaning liquid requires a bothersome control process, and wiping of the tool by means of air causes problems in terms of scattering of the cleaning liquid so that the liquid adheres to surrounding parts of the mechanism. Moreover, provision of the necessary equipment results in excessive cost.

SUMMARY OF THE INVENTION

Accordingly, the object of the present invention is to provide a single-point bonding apparatus in which there is no damage to the tool, so that the tool can be used up to the end of its inherent life cycle and in which the operating efficiency of the apparatus is improved and the cost of the tool member is reduced.

The above object is accomplished by a unique structure for a single-point bonding apparatus that connects end portions of leads or cut end portions of leads to pads respectively by pressing such end portions of leads or cut end portions of leads with a tool; and in the present invention a cleaning stage which is used to clean the tool is additionally provided, and a cleaning chip is provided on a surface of the cleaning stage.

In the above structure, the cleaning stage is provided between a heating block and one of guide rails that guide a tape on which the leads are disposed, such one of guide rails being located on the bonding apparatus side; and gas jetting openings are formed in an upper surface of the cleaning stage, the gas jetting openings being located adjacent to the heating block.

DETAILED DESCRIPTION OF THE INVENTION

Figure 1A:
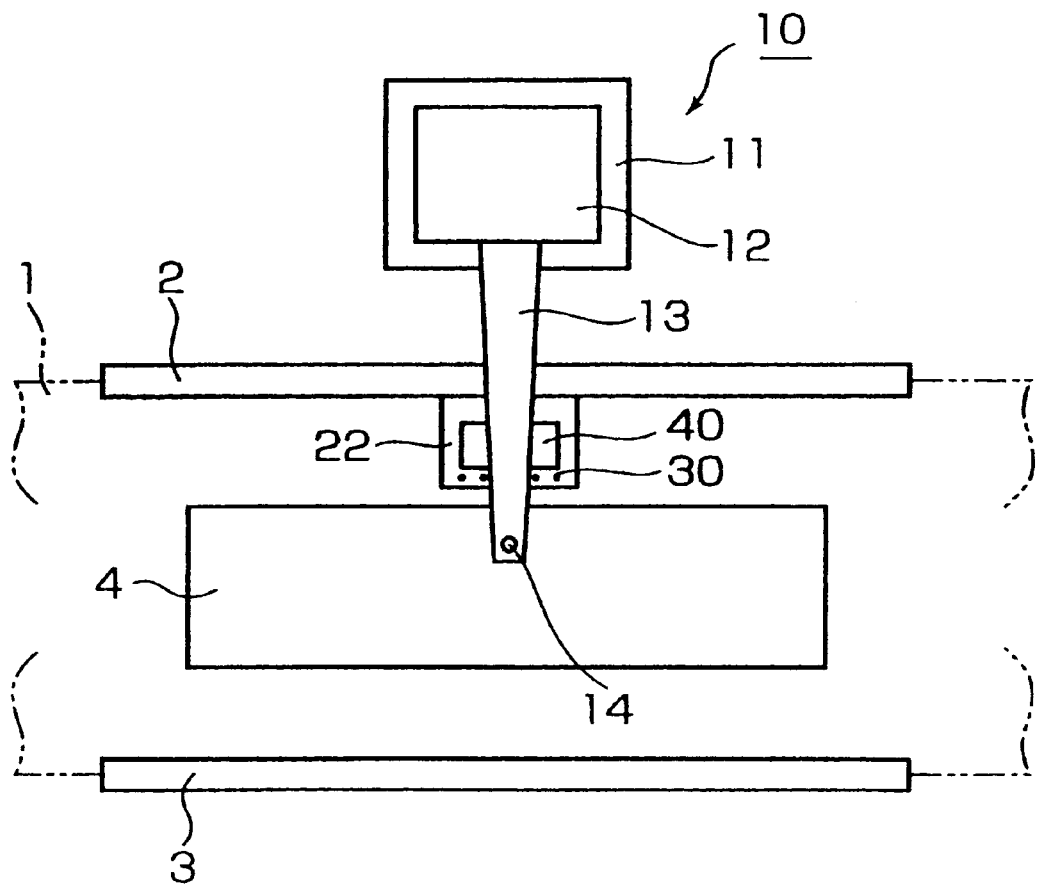
FIG. 1A is a top view of one embodiment of the single-point bonding apparatus of the present invention.
Figure 1B:
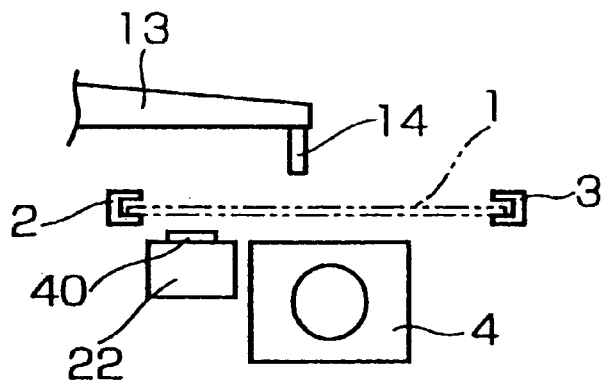
FIG. 1B is a side view thereof.

As seen from FIGS. 1A and 1B, a heating block 4 which heats a tape 1 on which leads (not shown) is installed between guide rails 2 and 3 which guide both sides of a tape 1. A bonding apparatus 10 is of a universally known structure and is disposed outside of the guide rail 2.

The bonding apparatus 10 is comprised substantially of a bonding head 12, which is mounted on a surface of an XY table 11 that is driven in the directions of the X and Y axes, and a bonding arm 13, which is installed on the bonding head 12 so that the bonding arm 13 is raised and lowered. The bonding arm 13 is raised and lowered by a Z axis driving means (not shown). In addition, a tool or a bonding tool 14 is fastened to the tip end portion of the bonding arm 13.

Figure 2A:
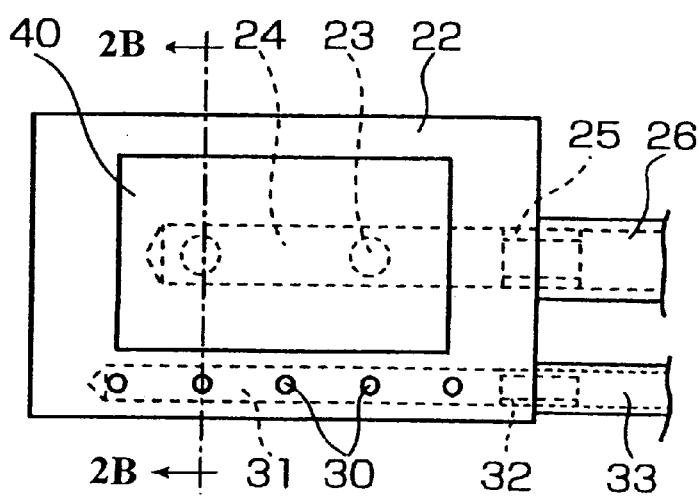
FIG. 2A is an enlarged plan view of the cleaning stage.
Figure 2B:
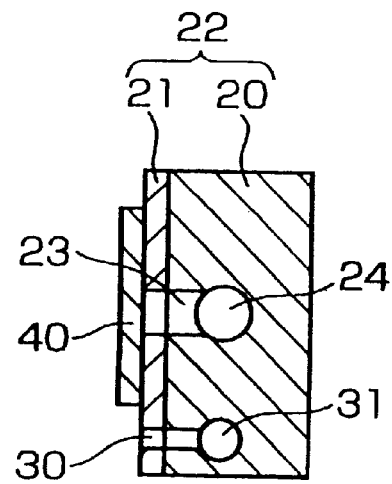
FIG. 2B is a sectional view taken along the line 2B—2B in FIG. 2A.

A cleaning stage 22 is disposed between the heating block 4 and the guide rail 2. The cleaning stage 22 is comprised of a cleaning stage main body 20 and a cleaning stage spacer 21 which is detachably provided on the cleaning stage main body 20. In this cleaning stage 22, as shown in FIGS. 2A and 2B, chip chucking openings 23 are formed in a vertical attitude so as to hold a cleaning chip 40 by vacuum suction.

A lateral hole 24 is formed in the cleaning stage 22 from the side surface so that the lateral hole 24 communicates with the chip chucking openings 23. A pipe connection coupling 25 is fastened to the lateral hole 24, and one end of a pipe 26 is connected to the pipe connection coupling 25. The other end of the pipe 26 is connected to a vacuum pump (not shown) via a valve controller (not shown).

Gas jetting openings 30 are formed in a vertical attitude in the upper surface of the cleaning stage 22. As best seen from FIG. 1A, the gas jetting openings 30 are disposed on the side adjacent to the heating block 4. In addition, a lateral hole 31 is formed in the cleaning stage 22 from the side surface so that the lateral hole 31 communicates with the gas jetting openings 30. A pipe connection coupling 32 is fastened to the lateral hole 31, and one end of a pipe 33 is connected to the pipe connection coupling 32. The other end of the pipe 33 is connected to a gas supply source (not shown) that supplies, for instance, nitrogen gas via a valve controller (not shown).

Furthermore, a product semiconductor chip or a mirror chip with a treatment equivalent to the pad surface treatment of a product semiconductor chip is used as the cleaning chip 40.

Next, the operation of the apparatus will be described.

Figure 3:
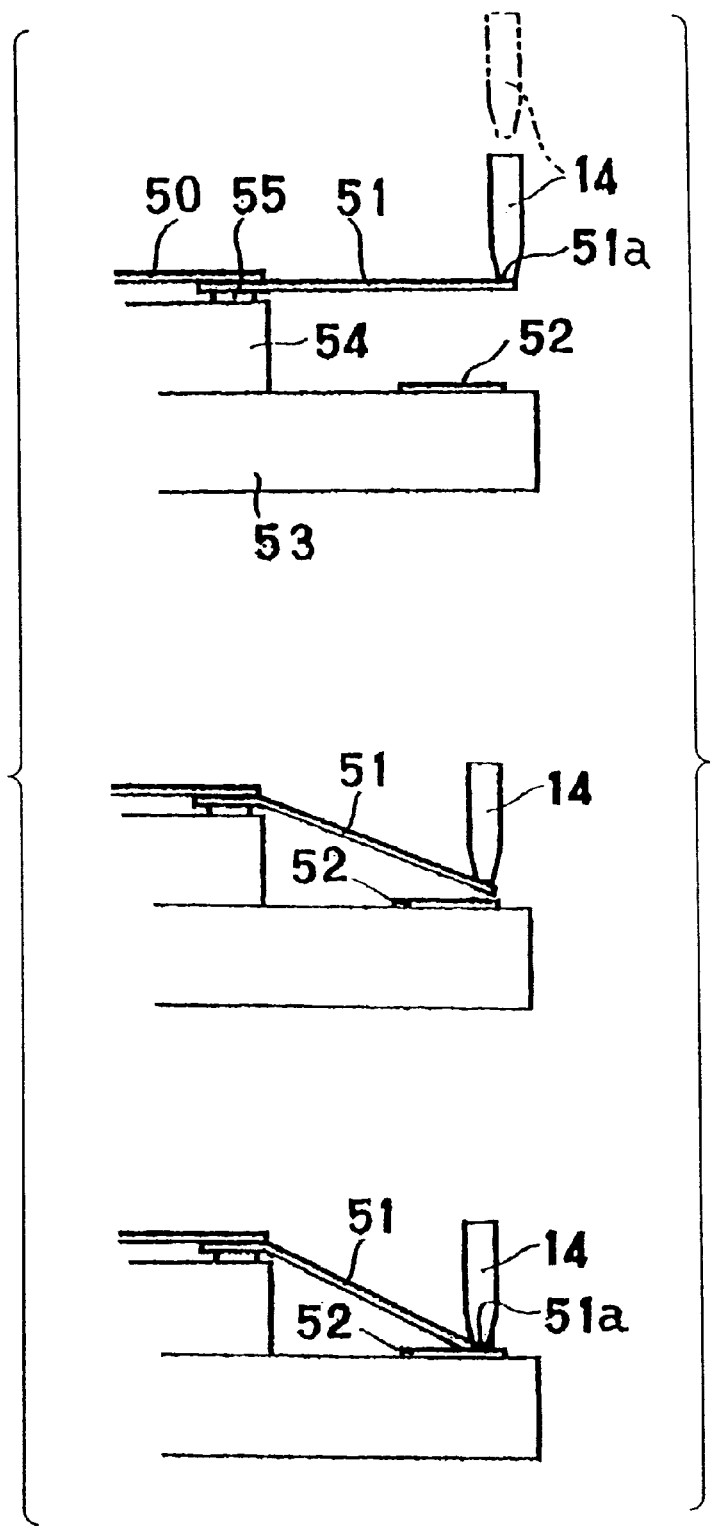
FIG. 3 shows the steps (a) through (c) of a conventional single-point bonding steps.

As described with reference to FIGS. 3A through 3C, single-point bonding is performed so that the end portions 51la of leads 51 or the cut end portions of leads 51 are connected respectively to pads 52 by way of pressing the leads 51 with the tool 14. Then, when the number of times that the tool 14 has been used exceeds a number set beforehand by a program, in other words, when cleaning of the tool 14 becomes necessary, the tool 14 is cleaned by the following operation.

When the tape 1 is not present above the cleaning stage 22, the XY table 11 is driven so that the tool 14 is moved to a point above the cleaning chip 40 of the cleaning stage 22.

Next, the Z axis driving means (not shown) is driven so as to lower the bonding arm 13, thus causing the tool 14 to make light pressing contact with the cleaning chip 40. When ultrasonic waves are applied to the bonding arm 13 in this state, contaminants on the tool 14 adhere to the cleaning chip 40, so that the tool 14 is cleaned.

Leads generally consist of a copper foil with gold plating thereon; and during bonding, the gold plating of the leads is deposited on the tool 14 as a result of friction with the tool 14, so that the gold plating becomes a contaminant. This contaminant, i.e., the deposit of gold, on the tool 14 shows good adhesion to the cleaning chip 40. Accordingly, when the tool 14 is caused to make light pressing contact with cleaning chip 40 and ultrasonic waves are applied as described above, the contaminant on the tool 14 readily adheres to the cleaning chip 40, and the tool 14 is cleaned. At the same time, other adhering dust that is discharged from the product member during boding is also stripped away during the cleaning.

As seen from the above, in the present invention, the cleaning operation is performed by causing the tool 14 to make light pressing contact with the cleaning chip 40 set on the surface of the cleaning stage 22 and then by applying ultrasonic waves. Accordingly, no damage occurs to the tool 14 even though the tip end of the tool is finely worked to a size of 125 µm square or smaller. Thus, the tool 14 can be used until the end of the inherent life cycle of the tool. As a result, the operating efficiency of the apparatus improves, and the cost of the tool member can be reduced.

Furthermore, even in cases where foreign matter adheres strongly to the tool 14, the foreign matter can be completely removed.

If the cleaning stage 22 is installed as close as possible to the tool 14, the amount of movement of the tool 14 during cleaning can be reduced. Thus, such an installation arrangement is desirable. Consequently, in the shown embodiment, the cleaning stage 22 is installed between the heating block 4 and the guide rail 2. Since the cleaning chip 40 is placed on the cleaning stage 22 for a long period of time, the cleaning chip tends to be oxidized by the heat of the heating block 4. Accordingly, nitrogen gas, for instance, is supplied from a gas supply source (not shown) and is jetted from the gas jetting openings 30 via the pipe 33, pipe connection coupling 32 and lateral hole 31. As seen from FIG. 1B, since the tape 1 is present above the cleaning chip 40 during cleaning, a gas atmosphere is created on the upper surface of the cleaning chip 40 by the nitrogen gas, etc., that is caused to jet from the gas jetting openings 30. As a result, the oxidation of the cleaning chip 40 can be prevented to the maximum extent possible.

In the above embodiment, the cleaning stage 22 is comprised of two bodies, i.e., the cleaning stage main body 20 and the cleaning stage spacer 21. However, the cleaning stage 22 can be constructed from a single body. If the cleaning stage 22 is of two bodies as in the shown embodiment, the height of the cleaning chip 40 is adjusted to the same height as the bonding level of the product by replacing the cleaning stage spacer 21 in accordance with the thickness of the product semiconductor chip when there is a change in the type of product being handled. As a result, the cleaning can be performed by setting bonding parameters similar to those used for the product, so that cleaning can be accomplished without applying a greater-than-necessary load to the tool 14.

As seen from the above, according to the present invention, in a single-point bonding apparatus which connects the end portions of leads or the cut end portions of leads respectively to pads by pressing such end portions of leads or cut end portions of leads with a tool, a cleaning stage for cleaning the tool is further provided, and a cleaning chip is set on the surface of the cleaning stage. Accordingly, no damage occurs to the tool, and the tool can be used to the end of its inherent life cycle. As a result, the operating efficiency of the bonding apparatus improves, and the cost of the tool member can be reduced.

What is claimed is:

1. A single-point bonding apparatus which connects end portions of leads or cut end portions of leads to pads respectively by pressing such end portions of leads or cut end portions of leads with a tool, wherein a cleaning stage which is used to clean said tool is provided, and a cleaning chip is provided on a surface of said cleaning stage.

2. The single-point bonding apparatus according to claim 1, wherein said cleaning stage is provided between a heating block and one of guide rails that guide a tape on which said leads are disposed, said one of guide rails being located on said bonding apparatus side, and gas jetting openings are formed in an upper surface of said cleaning stage.

* * * * *